United States Patent
Doi

(10) Patent No.: US 10,850,682 B2
(45) Date of Patent: Dec. 1, 2020

(54) INTERIOR MEMBER FOR VEHICLE

(71) Applicant: TOYOTA JIDOSHA KABUSHIKI KAISHA, Toyota (JP)

(72) Inventor: Madoka Doi, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 90 days.

(21) Appl. No.: 16/205,273

(22) Filed: Nov. 30, 2018

(65) Prior Publication Data

US 2019/0168689 A1 Jun. 6, 2019

(30) Foreign Application Priority Data

Dec. 6, 2017 (JP) .................. 2017-234498

(51) Int. Cl.
| | |
|---|---|
| *B60R 13/02* | (2006.01) |
| *B60R 16/03* | (2006.01) |
| *B32B 27/06* | (2006.01) |
| *B60K 37/04* | (2006.01) |
| *H05K 3/10* | (2006.01) |
| *H05K 3/00* | (2006.01) |
| *B60R 16/02* | (2006.01) |

(52) U.S. Cl.
CPC ........ *B60R 13/0256* (2013.01); *B32B 27/065* (2013.01); *B60K 37/04* (2013.01); *B60R 16/02* (2013.01); *B60R 16/03* (2013.01); *H05K 3/0014* (2013.01); *H05K 3/101* (2013.01); *B32B 2266/0278* (2013.01); *B32B 2605/00* (2013.01); *B60K 2370/46* (2019.05); *B60R 2013/0287* (2013.01)

(58) Field of Classification Search
CPC ..... B60R 16/03; B60R 13/0256; B60R 16/02; B60R 2013/0287; B32B 27/065; B32B 2266/0278; B32B 2605/00; B60K 37/04; B60K 2370/46; H05K 3/101; H05K 3/0014
USPC ....................................... 296/1.08
See application file for complete search history.

(56) References Cited

U.S. PATENT DOCUMENTS

| | | | | |
|---|---|---|---|---|
| 5,533,748 A | * | 7/1996 | Wirt | .................... B29C 37/0057 280/728.3 |
| 6,428,081 B1 | * | 8/2002 | Williams, Jr. | ...... B29C 45/1671 296/146.1 |
| 2002/0041110 A1 | | 4/2002 | Odashima et al. | |

FOREIGN PATENT DOCUMENTS

| | | |
|---|---|---|
| JP | 62-137746 U | 8/1987 |
| JP | 63-166508 A | 7/1988 |
| JP | 6-334305 A | 12/1994 |

(Continued)

*Primary Examiner* — Joseph D. Pape
*Assistant Examiner* — Dana D Ivey
(74) *Attorney, Agent, or Firm* — Oblon, McClelland, Maier & Neustadt, L.L.P.

(57) ABSTRACT

An interior member for a vehicle includes: a base material formed of a resin; a front surface portion configured to constitute a portion of a design surface in a vehicle cabin and cover a surface of the base material that is on the design surface side; and a conductive portion integrally provided with the base material in a state where a portion of the conductive portion that is opposite to the design surface is in close contact with the base material and a portion of the conductive portion that is on the design surface side faces the front surface portion such that power is supplied to an electrical component installed in the vehicle through the conductive portion, the conductive portion being formed of a metal.

7 Claims, 5 Drawing Sheets

(56) References Cited

FOREIGN PATENT DOCUMENTS

| | | |
|---|---|---|
| JP | 08-216733 | 8/1996 |
| JP | 2000-203311 A | 7/2000 |
| JP | 2000-301931 A | 10/2000 |
| JP | 2002-19544 A | 1/2002 |
| WO | WO 2017/165294 A1 | 9/2017 |

* cited by examiner

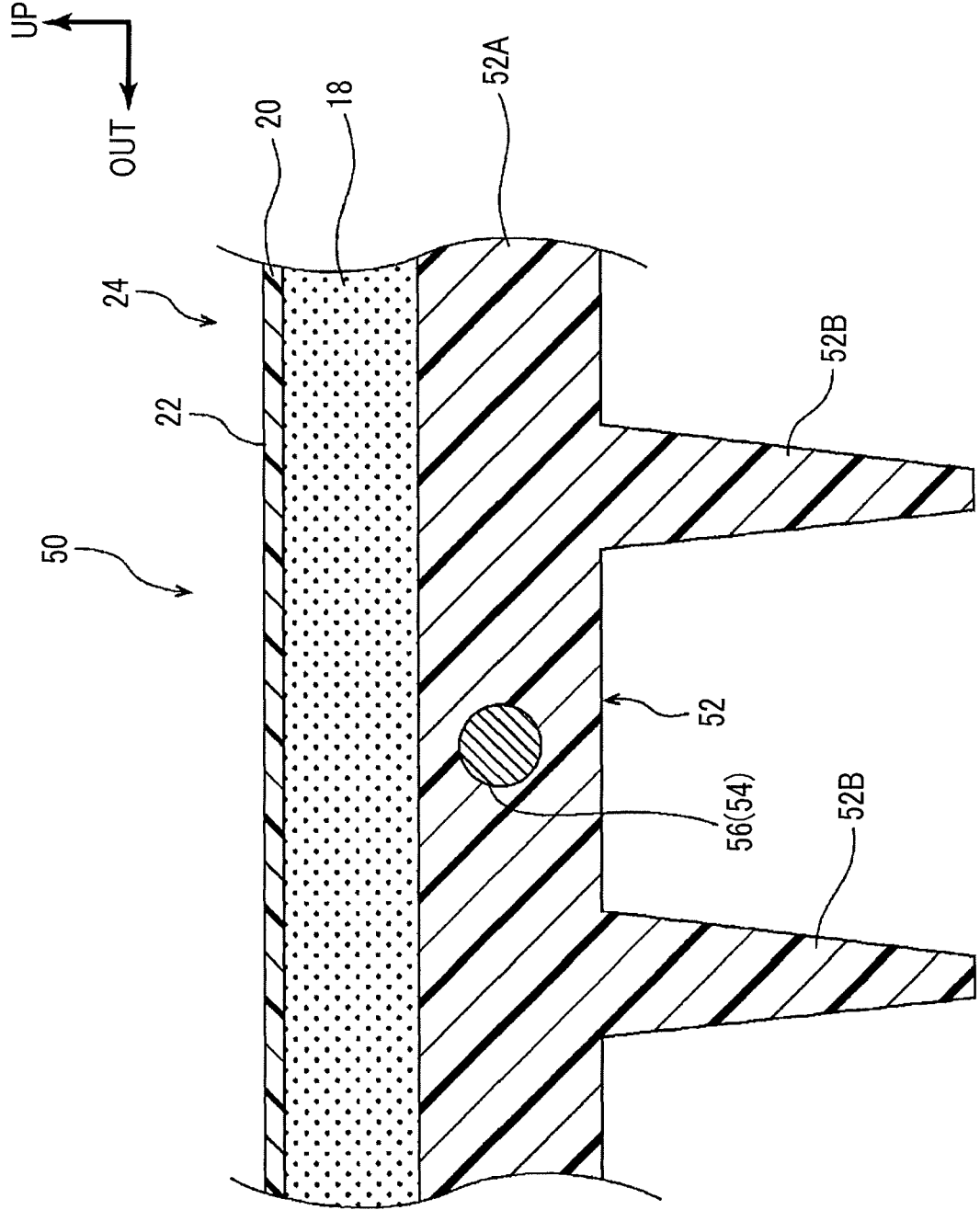

INTERIOR MEMBER FOR VEHICLE

INCORPORATION BY REFERENCE

The disclosure of Japanese Patent Application No. 2017-234498 filed on Dec. 6, 2017 including the specification, drawings and abstract is incorporated herein by reference in its entirety.

BACKGROUND

1. Technical Field

The disclosure relates to an interior member for a vehicle.

2. Description of Related Art

Examples of an interior member for a vehicle include various members such as an instrument panel or a door trim. For example, Japanese Unexamined Patent Application Publication No. 8-216733 (JP 8-216733 A) discloses an disclosure related to an electrical component mounted body. In the case of the electrical component mounted body, a rear surface (surface opposite to design surface) of an insert base material constituting a portion of an instrument panel is provided with a film-shaped wiring body, the film-shaped wiring body being integrated with the insert base material. An insulation film is removed from a portion of the film-shaped wiring body that comes into contact with an electrical component such that a conductive portion printed on a front surface of the film-shaped wiring body is exposed. Therefore, in the related art, a conductive portion of the electrical component and the conductive portion of the wiring body are in contact with each other and thus it is possible to electrically connect the electrical component and the wiring body to each other without routing a wire harness or the like close to a rear surface of the instrument panel.

SUMMARY

In the related art, the insert base material and the electrical component need to be in direct contact with each other. Therefore, there is room for improvement in a point that there is a limit on the degree of freedom in designing a portion of the electrical component that is opposite to the design surface of the instrument panel and the vicinity thereof.

The disclosure provides an interior member for a vehicle with which it is possible to supply power to an electrical component without routing a wire harness or the like and to secure the degree of freedom in designing a portion opposite to a design surface and the vicinity thereof.

A first aspect of the disclosure relates to an interior member for a vehicle. The interior member includes a base material formed of a resin, a front surface portion, and a conductive portion. The front surface portion is configured to constitute a portion of a design surface in a vehicle cabin and cover a surface of the base material that is on the design surface side. The conductive portion is integrally provided with the base material in a state where a portion of the conductive portion that is opposite to the design surface is in close contact with the base material and a portion of the conductive portion that is on the design surface side faces the front surface portion such that power is supplied to an electrical component installed in the vehicle through the conductive portion, the conductive portion being formed of a metal.

According to the first aspect of the disclosure, the base material formed of a resin and the front surface portion constituting a portion of the design surface in the vehicle cabin are provided and the front surface portion covers the surface of the base material that is on the design surface side.

It is conceivable to route a wire harness or the like connected to the electrical component along the surface of the base material that is opposite to the design surface of the interior member for a vehicle in order to secure the design of the inside of the vehicle cabin when disposing the electrical component in the vehicle cabin. When the configuration as described above is adopted, it may be difficult to secure the degree of freedom in designing a portion of the base material that is opposite to the design surface of the interior member for a vehicle and the vicinity thereof.

According to the first aspect of the disclosure, the conductive portion formed of a metal is integrally provided with the base material and it is possible to supply power to the electrical component installed in the vehicle through the conductive portion without routing the wire harness or the like in the vicinity of the base material. The conductive portion is provided in the base material in a state where a portion of the conductive portion that is opposite to the design surface in the vehicle cabin is in close contact with the base material and a portion of the conductive portion that is on the design surface side faces the front surface portion, and the conductive portion and the base material can be formed through or insert molding or two-color molding. Therefore, even when the base material is provided with the conductive portion, the influence of the conductive portion on the configuration of a portion of the base material that is opposite to the design surface in the vehicle cabin can be further suppressed.

In the interior member according to the first aspect of the disclosure, the base material and the conductive portion may be formed through two-color molding and may constitute an integrated molded product.

According to the first aspect of the disclosure, the base material and the conductive portion are formed through two-color molding and constitute an integrated molded product. Therefore, it is possible to simplify an operation of mounting the interior member for a vehicle and to improve the degree of freedom in designing the interior member for a vehicle in comparison with a case where the base material and the conductive are configured separately from each other.

A second aspect of the disclosure relates to an interior member for a vehicle. The interior member includes a base material formed of a resin, a front surface portion, and a conductive portion. The front surface portion constitutes a portion of a design surface in a vehicle cabin and covers a surface of the base material that is on the design surface side. The conductive portion is built into the base material such that power is supplied to an electrical component installed in the vehicle through the conductive portion, the conductive portion being formed of a metal.

The interior member according to the second aspect of the disclosure has basically the same configuration as the interior member according to the first aspect of the disclosure, and exhibits the same operation as that of the interior member according to the first aspect of the disclosure. According to the second aspect of the disclosure, the conductive portion is built into the base material and the influence of the conductive portion on the configuration of a portion of the base material that is close to the design surface in the vehicle cabin and a portion of the base material that is opposite to design surface can be further suppressed.

In the interior member according to the first and second aspects of the disclosure, the base material may be provided with a rib portion that protrudes from a surface of the base material that is opposite to the design surface.

According to the first and second aspects of the disclosure, the base material is provided with the rib portion and the rib portion protrudes from the surface of the base material that is opposite to the design surface in the vehicle cabin. Therefore, it is possible to reinforce the base material with the rib portion without an influence on the design surface of the interior member for a vehicle.

In the interior member according to the first and second aspects of the disclosure, a portion of the conductive portion may be exposed at a surface of the base material that is opposite to the design surface.

According to the first and second aspects of the disclosure, a portion of the conductive portion is exposed at the surface of the base material that is opposite to the design surface in the vehicle cabin and the electrical component disposed in the vehicle cabin can be connected to the conductive portion at a portion of the base material that is opposite to the design surface.

In the interior member according to the first and second aspects of the disclosure, the base material may constitute a portion of an instrument panel and the front surface portion may include a foam layer that is in close contact with the base material while being disposed on a portion of the base material that is on the design surface side and a cover material that constitutes the design surface and is in close contact with the foam layer.

According to the first and second aspects of the disclosure, the base material constitutes a portion of the instrument panel and the foam layer is disposed on a portion of the base material that is close to the design surface in the vehicle cabin in a state of being in close contact with the base material. The cover material constituting the design surface in the vehicle cabin is in close contact with the foam layer. Therefore, it is possible to further improve the design and texture of the instrument panel and it is possible to use the conductive portion when supplying power to the electrical component disposed in the vicinity of the instrument panel.

As described above, the interior member according to the first aspect of the disclosure has an excellent effect that it is possible to supply power to an electrical component without routing a wire harness or the like and to secure the degree of freedom in designing a portion opposite to a design surface and the vicinity thereof.

The interior member according to the first aspect of the disclosure further has an excellent effect that it is possible to improve the degree of freedom in designing a design surface in a vehicle cabin while reducing the number of processes for assembling the vehicle cabin.

The interior member according to the second aspect of the disclosure has the same effects as those of the interior member according to the first aspect of the disclosure.

The interior member according to the first and second aspects of the disclosure further has an excellent effect that it is possible to secure the design of the design surface of the interior member for a vehicle and to stably support a load that is applied to the design surface from the inside of the vehicle cabin.

The interior member according to the first and second aspects of the disclosure further has an excellent effect that it is possible to effectively use a space in the vicinity of the interior member for a vehicle since connection point of the electrical component is set in the vicinity of the interior member for a vehicle.

The interior member according to the first and second aspects of the disclosure further has an excellent effect that it is possible to make the instrument panel look luxurious and it is possible to simplify an operation of attaching the electrical component in the vicinity of the instrument panel.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 5 is an enlarged sectional view illustrating a configuration of a main part of an instrument panel according to a second embodiment as seen in the vehicle front-rear direction.

DETAILED DESCRIPTION OF EMBODIMENTS

First Embodiment

Figure 1:
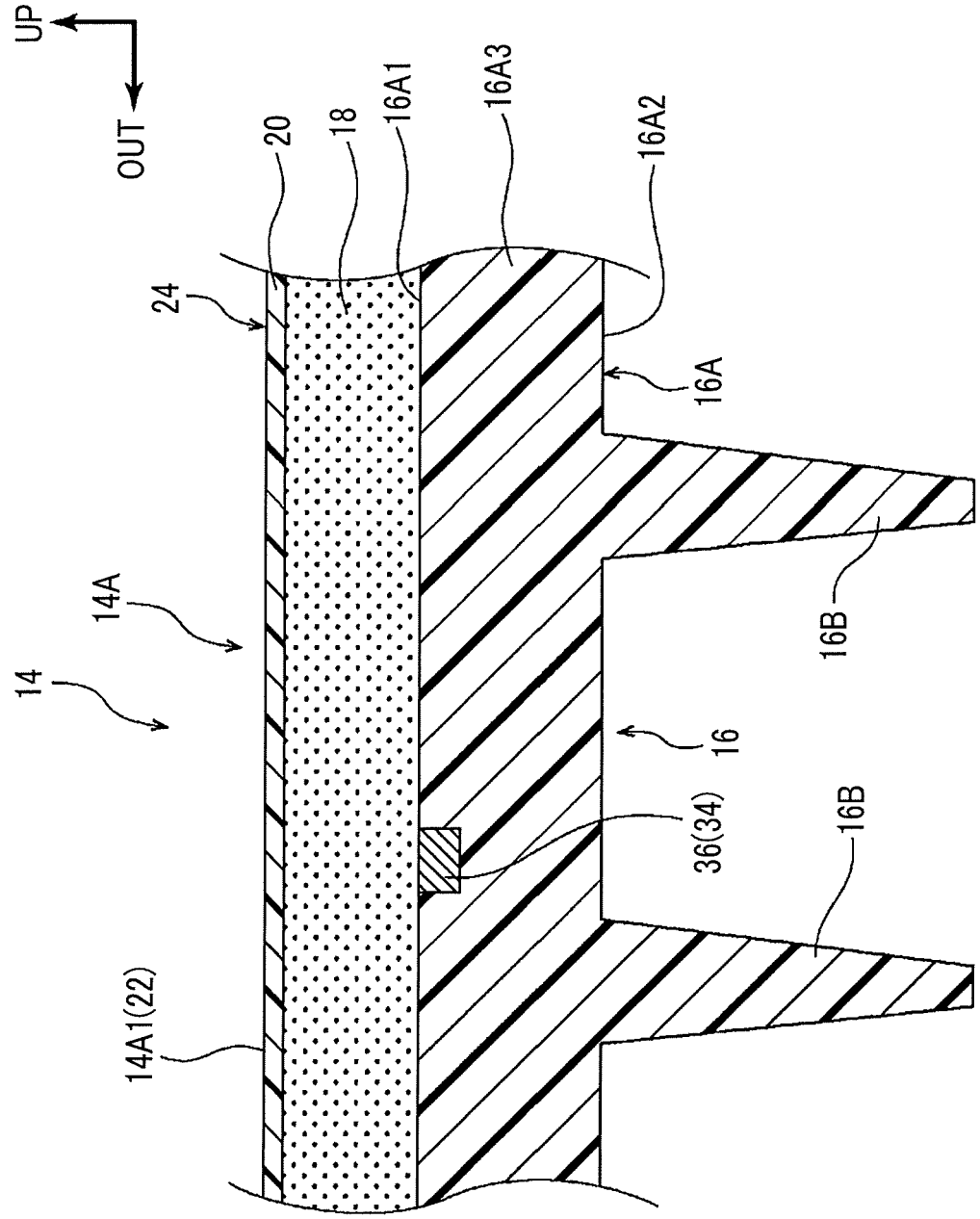
FIG. 1 is an enlarged sectional view (sectional view taken along line I-I in FIG. 4) illustrating a configuration of a main part of an instrument panel according to a first embodiment as seen in a vehicle front-rear direction.

Hereinafter, an interior member for a vehicle according to a first embodiment of the disclosure will be described by using FIGS. 1 to 4. An arrow FR appropriately shown in the drawings represents a vehicle front side, an arrow UP represents a vehicle upper side, and an arrow OUT represents an outer side in a vehicle width direction.

Figure 4:
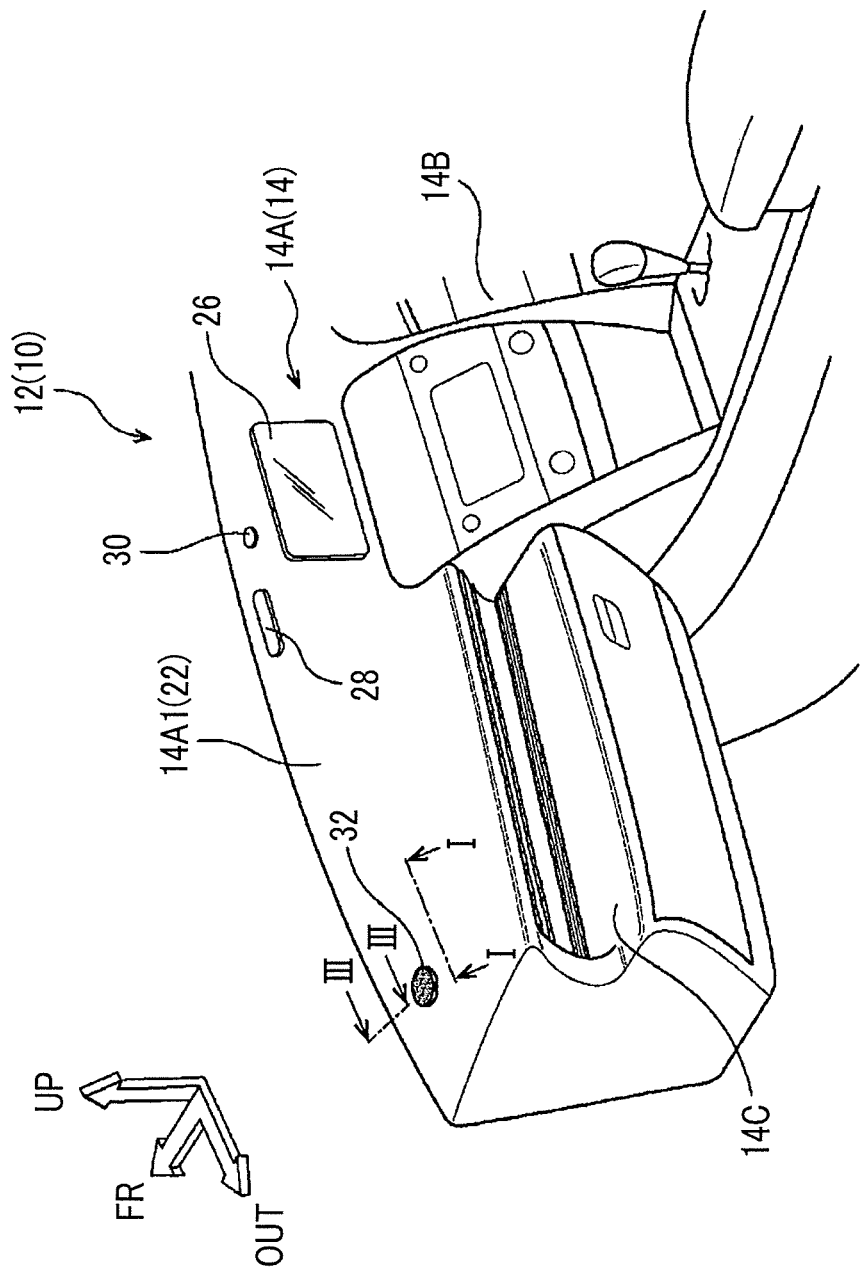
FIG. 4 is a perspective view illustrating a configuration inside a vehicle cabin of a vehicle according to the first embodiment.

As illustrated in FIG. 4, an instrument panel 14 as the interior member for a vehicle is disposed on the vehicle front side in a "vehicle cabin 12" of a "vehicle 10". The instrument panel 14 is configured to include an instrument panel upper portion 14A that constitutes a vehicle upper side portion of the instrument panel 14 and extends in the vehicle width direction and a vehicle front-rear direction, an instrument panel lower portion 14B that is provided to face a driver's seat (not shown), and an instrument panel lower portion 14C that is provided to face a passenger seat (not shown).

Hereinafter, the configuration of the instrument panel 14 will be described in more detail by using the configuration of the instrument panel upper portion 14A as an example. As illustrated in FIG. 1, the instrument panel 14 is configured to include a "base material 16" formed of a resin, a "foam layer 18" configured with foamed resin such as polyurethane, and a "cover material 20" configured with synthetic leather or the like. Regarding the base material 16, the major portion of the base material 16 is configured with a main body portion 16A formed in a plate-like shape and a "front surface 16A1" of the main body portion 16A is covered with the foam layer 18 and the cover material 20, the front surface 16A1 being positioned close to a design surface 22 in the vehicle cabin 12. Hereinafter, a portion configured with the cover material 20 and the foam layer 18 will be referred to as a "front surface portion 24". A rear surface 16A2 of the main body portion 16A is provided with a plurality of "rib portions 16B" that protrudes in a thickness direction of the main body portion 16A from the rear surface 16A2 that is opposite to the front surface 16A1.

Each rib portion 16B illustrated in FIG. 1 has a plate-like shape extending in the vehicle front-rear direction, for example. However, each rib portion 16B may have a plate-like shape extending in a direction other than the vehicle front-rear direction and may be formed to have a grid shape as seen from the thickness direction of the main body portion 16A.

The foam layer 18 is provided along the front surface 16A1 of the main body portion 16A of the base material 16 in a state where the thickness thereof is constant and is in close contact with the base material 16. A portion of the foam layer 18 that is on the design surface 22 side is covered by the sheet-shaped cover material 20 constituting a portion of the design surface 22 and is in close contact with the cover material 20.

Referring again to FIG. 4, a plurality of electrical components is disposed on an upper surface 14A1 (portion of design surface 22) of the instrument panel upper portion 14A that is on the vehicle upper side. Specifically, a "head-up display 26" is disposed on a portion of the upper surface 14A1 of the instrument panel upper portion 14A that is positioned behind the central portion of the upper surface 14A1 in the vehicle front-rear direction. A "beacon sensor 28" and an "auto-light sensor 30" are disposed on a portion of the upper surface 14A1 of that is positioned ahead of the central portion of the upper surface 14A1 in the vehicle front-rear direction. A "speaker 32" is disposed on a portion the upper surface 14A1 that is positioned on an outer side in the vehicle width direction.

The first embodiment has a feature that a portion (hereinafter, referred to as "base material upper portion 16A3") of the main body portion 16A of the base material 16 that constitutes the instrument panel upper portion 14A is integrated with a "conductive portion 34" through which power is supplied to the electrical components disposed on the upper surface 14A1 of the instrument panel upper portion 14A as illustrated in FIG. 1. Hereinafter, the configuration of the conductive portion 34 which is a main part of the first embodiment will be described in detail.

The conductive portion 34 is formed of a metal. More specifically, the conductive portion 34 is formed of an alloy of tin and zinc or copper. The conductive portion 34 and the base material 16 are formed into an integrated molded product through two-color molding. That is, as resin constituting the base material 16, resin of which the melting point is approximately the same as that of metal constituting the conductive portion 34 is used and examples of the resin constituting the base material 16 include super engineering plastic such as polyimide.

Figure 2:
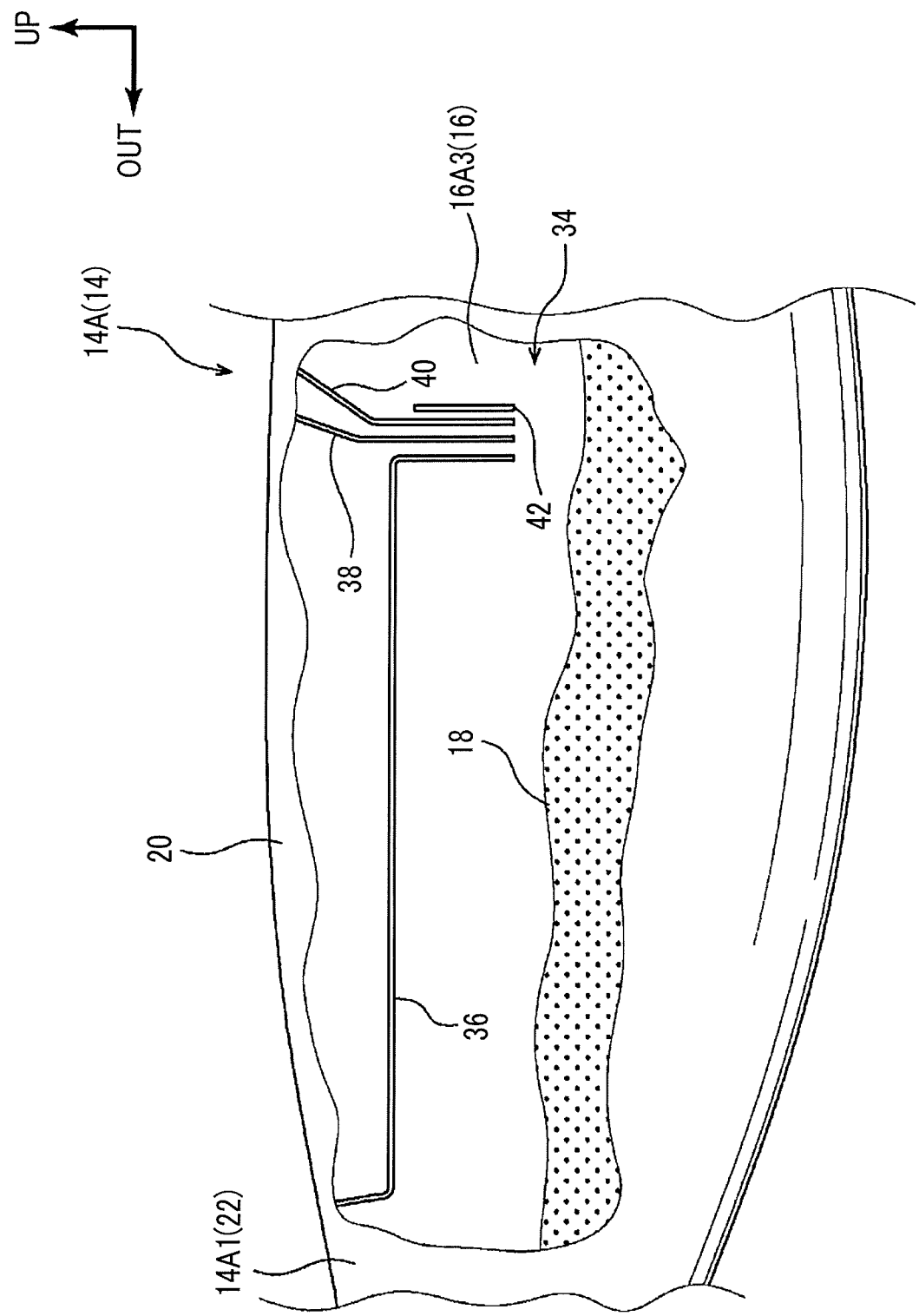
FIG. 2 is a plan view illustrating a configuration of the instrument panel according to the first embodiment.

As illustrated in FIG. 2, the conductive portion 34 is provided with a linear portion 36, a linear portion 38, a linear portion 40, and a linear portion 42 and the linear portion 36, the linear portion 38, the linear portion 40, and the linear portion 42 are formed to be linear as seen in a vehicle height direction. A portion of each of the linear portion 36, the linear portion 38, the linear portion 40, and the linear portion 42 that is opposite to the design surface 22 is in close contact with the base material upper portion 16A3 and a portion of each of the linear portion 36, the linear portion 38, the linear portion 40, and the linear portion 42 that is on the design surface 22 side faces the foam layer 18. In the first embodiment, a portion of each of the linear portion 36, the linear portion 38, the linear portion 40, and the linear portion 42 that is on the design surface 22 side is in close contact with the foam layer 18. However, a gap may be present between the above-described portion and the foam layer 18. In a state where the cover material 20 and the foam layer 18 are not attached to the base material 16, the conductive portion 34 can be visually recognized as seen from the vehicle upper side.

More specifically, the linear portion 36, the linear portion 38, the linear portion 40, and the linear portion 42 extend to corresponding electrical components starting from the central portion of the base material upper portion 16A3 as seen from the vehicle upper side. Power can be supplied to the speaker 32 through the linear portion 36, can be supplied to the beacon sensor 28 through the linear portion 38, can be supplied to the auto-light sensor 30 through the linear portion 40, and can be supplied to the head-up display 26 through the linear portion 42. The thickness (sectional shape as seen in direction in which linear portions extend) of each of the linear portion 36, the linear portion 38, the linear portion 40, and the linear portion 42 may be appropriately changed according to power needed for the corresponding electrical component.

Figure 3:
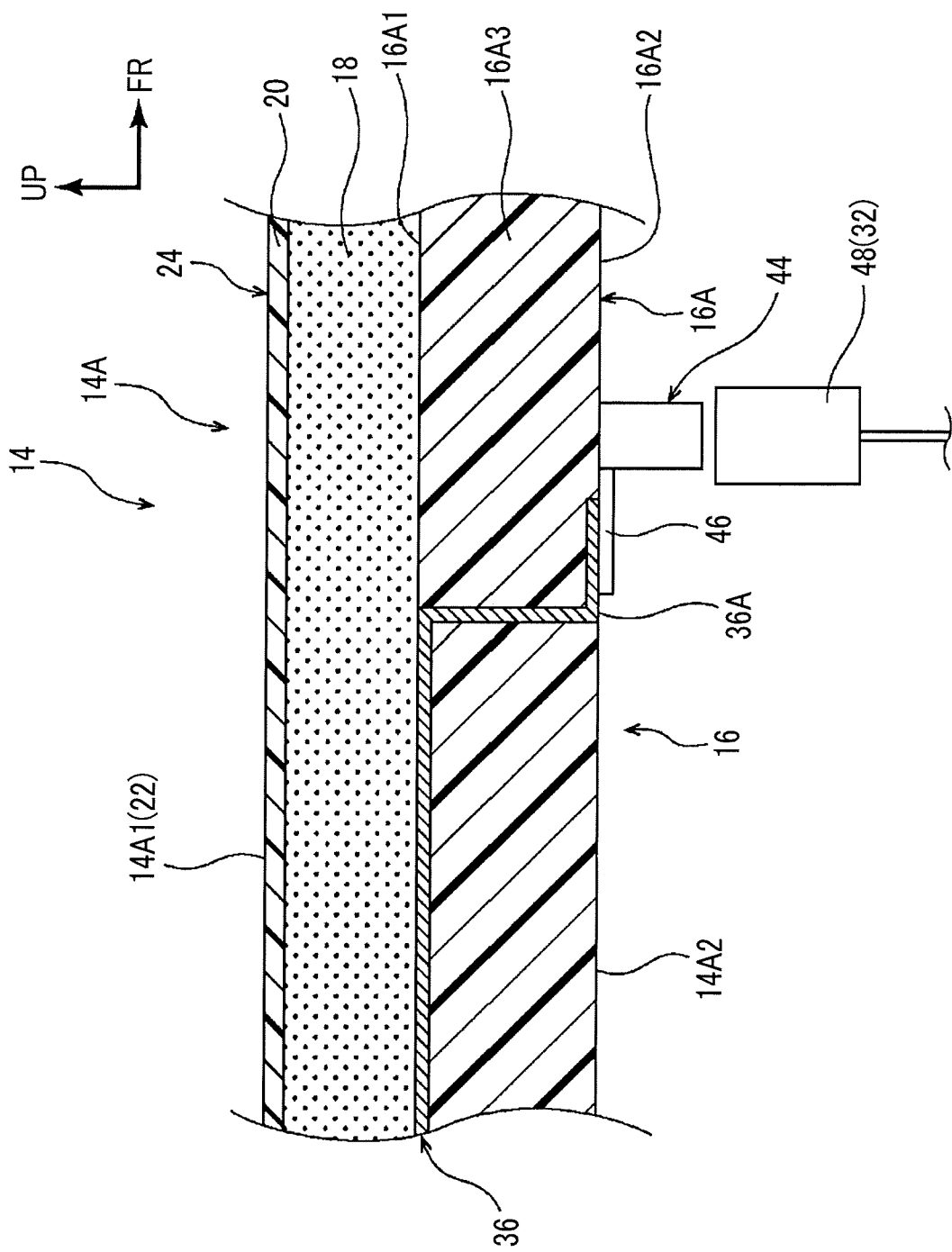
FIG. 3 is an enlarged sectional view (sectional view taken along line III-III in FIG. 4) illustrating a configuration of the main part of the instrument panel according to the first embodiment as seen in a vehicle width direction.

The configuration of connection points between the conductive portion 34 and the electrical components will be described by using the linear portion 36 as an example. As illustrated in FIG. 3, the linear portion 36 extends toward a vehicle lower side while passing through the base material upper portion 16A3 at the vicinity of the speaker 32 and a portion thereof is exposed as seen from the vehicle lower side at a position close to a lower surface 14A2 of the instrument panel upper portion 14A that is opposite to the upper surface 14A1 (hereinafter, above-described portion will be described as "exposed portion 36A"). The lower surface 14A2 of the instrument panel upper portion 14A is provided with a connector 44 and a terminal portion 46 of the connector 44 and the exposed portion 36A are bonded to each other such that the linear portion 36 and the connector 44 are electrically connected to each other. A connector 48 of the speaker 32 can be connected to the connector 44 and power from an in-vehicle power source such as a battery (not shown) can be supplied to the speaker 32 through the linear portion 36.

The starting point (not shown) of each of the linear portion 36, the linear portion 38, the linear portion 40, and the linear portion 42 extends to the vehicle lower side while passing through the base material upper portion 16A3 at the central portion of the base material upper portion 16A3 and a portion thereof is exposed as seen from the vehicle lower side at a position close to the lower surface 14A2 of the instrument panel upper portion 14A. The central portion of the lower surface 14A2 is provided with a connector (not shown) and the connector is electrically connected to the portion of the starting point of each of the linear portion 36, the linear portion 38, the linear portion 40, and the linear portion 42 that is exposed as seen from the vehicle lower side. A connector (not shown) of a wire harness electrically connected to the in-vehicle power source is connected to the connector and power from the in-vehicle power source can be supplied to the linear portion 36, the linear portion 38, the linear portion 40, and the linear portion 42 through the connector. A portion of the conductive portion 34 that is not covered with the front surface portion 24 and is not used for connection to the connector is covered with an insulation film.

Operation and Effect of First Embodiment

The operation and the effect of the first embodiment will be described.

In the case of the first embodiment, the base material 16 formed of a resin and the front surface portion 24 constituting a portion of the design surface 22 in the vehicle cabin 12 are provided and the front surface portion 24 covers the front surface 16A1 of the base material 16 that is on the design surface 22 side.

It is conceivable to route the wire harness or the like connected to the electrical components along the rear surface 16A2 of the base material 16 that is opposite to the design surface of the instrument panel 14 in order to secure the design of the inside of the vehicle cabin 12 when disposing the electrical components in the vehicle cabin 12. When the configuration as described above is adopted, it may be difficult to secure the degree of freedom in designing a portion of the base material 16 that is opposite to the design surface of the instrument panel 14 and the vicinity thereof.

In the case of the first embodiment, the conductive portion 34 formed of a metal is integrally provided with the base material 16 and it is possible to supply power to the electrical components installed in the vehicle 10 through the conductive portion 34 without routing the wire harness or the like in the vicinity of the base material 16. The conductive portion 34 is provided in the base material 16 in a state where a portion of the conductive portion 34 that is opposite to the design surface 22 is in close contact with the base material 16 and a portion of the conductive portion 34 that is on the design surface 22 side faces the front surface portion 24 and the conductive portion 34 and the base material 16 can be formed through two-color molding. Therefore, even when the base material 16 is provided with the conductive portion 34, the influence of the conductive portion 34 on the configuration of a portion of the base material 16 that is opposite to the design surface 22 can be further suppressed.

In the case of the first embodiment, it is possible to supply power to the electrical components without routing the wire harness or the like along the rear surface 16A2 of the base material 16 and it is possible to secure the degree of freedom in designing a portion of the instrument panel 14 that is opposite to the design surface 22 and the vicinity thereof. Specifically, it is possible to provide the rib portions 16B or the like on the portion of the instrument panel 14 that is opposite to the design surface 22 and it is possible to secure a space in which various electrical components are disposed on a side of the instrument panel 14 that is opposite to the design surface 22.

In the case of the first embodiment, the base material 16 and the conductive portion 34 are formed through two-color molding and constitute an integrated molded product. Therefore, it is possible to simplify an operation of mounting the instrument panel 14 and to improve the degree of freedom in designing the instrument panel 14 in comparison with a case where the base material 16 and the conductive portion 34 are configured separately from each other. Therefore, in the case of the first embodiment, it is possible to improve the degree of freedom in designing the design surface 22 in the vehicle cabin 12 while reducing the number of processes for assembling the vehicle cabin 12.

In the case of the first embodiment, the base material 16 is provided with the rib portions 16B and the rib portions 16B protrude from the rear surface 16A2 of the base material 16 that is opposite to the design surface 22. Therefore, it is possible to reinforce the base material 16 with the rib portions 16B without an influence on the design surface of the instrument panel 14. Accordingly, in the case of the first embodiment, it is possible to secure the design of the design surface of the instrument panel 14 and to stably support a load that is applied to the design surface from the inside of the vehicle cabin 12 when the design surface is pressed by an occupant.

In the case of the first embodiment, a portion of the conductive portion 34 is exposed at a surface of the base material 16 that is opposite to the design surface 22 and the electrical components disposed in the vehicle cabin 12 can be connected to the conductive portion 34 at a portion of the base material 16 that is opposite to the design surface 22. Therefore, in the case of the first embodiment, it is possible to effectively use a space in the vicinity of the instrument panel 14 since connection points of the electrical components are set in the vicinity of the instrument panel 14.

In the case of the first embodiment, the base material 16 provided with the conductive portion 34 constitutes a portion of the instrument panel 14 and the front surface portion 24 is configured to include the foam layer 18 that is in close contact with the base material 16 while being disposed on a portion of the base material 16 that is on the design surface 22 side and the cover material 20 that constitutes the design surface 22 and is in close contact with the foam layer 18. Therefore, it is possible to further improve the design and texture of the instrument panel 14 and it is possible to use the conductive portion 34 when supplying power to the electrical components disposed in the vicinity of the instrument panel 14. Therefore, in the case of the first embodiment, it is possible to make the instrument panel 14 look luxurious and it is possible to simplify an operation of attaching the electrical components in the vicinity of the instrument panel 14.

Second Embodiment

Hereinafter, an interior member for a vehicle according to a second embodiment of the disclosure will be described by using FIG. 5. The same components as those in the first embodiment will be given the same reference numerals and description thereof will be omitted.

Basically, an instrument panel 50 as the interior member for a vehicle according to the second embodiment is configured in the same manner as the instrument panel 14. However, the instrument panel 50 has a feature in a point that a "conductive portion 54" formed of a metal is built into a main body portion 52A of a "base material 52".

The conductive portion 54 is configured to include linear portions respectively corresponding to the linear portion 36, the linear portion 38, the linear portion 40, and the linear portion 42 and the conductive portion 54 is integrally molded with the base material 52 through insert molding. As metal constituting the conductive portion 54, metal of which the melting point is higher than the melting point of resin constituting the base material 52 is used. For example, a linear portion 56 that corresponds to the linear portion 36 is illustrated in FIG. 5.

The conductive portion 54 may be configured by pouring molten metal into the base material 52 formed with a cavity portion. In a case where the above described manufacturing method is adopted, metal of which the melting point is lower than the melting point of resin constituting the base material 52 is used as metal constituting the conductive portion 54.

As with the base material 16, the base material 52 is provided with a plurality of "rib portions 52B".

With the above-described configuration, it is possible to achieve the same operation and effect as those in the first embodiment, excluding an operation and an effect achieved by a fact that the base material 16 and the conductive portion 34 are formed through two-color molding.

In the case of the second embodiment, the conductive portion 54 is built into the base material 52 and the influence of the conductive portion 54 on the configuration of a portion of the base material 52 that is close to the design surface 22 in the vehicle cabin 12 and a portion of the base material 52 that is opposite to the design surface 22 can be further suppressed.

Supplementary Description on Embodiments

In the embodiments, the instrument panel 14 and the instrument panel 50 have been used examples of the interior member for a vehicle. However, a door trim or the like may have the same configuration as the instrument panel 14 and the instrument panel 50 such that the door trim or the like is provided with the conductive portion 34 or the conductive portion 54.

In the embodiments, the front surface portion 24 is configured to include the foam layer 18 and the cover material 20. However, the front surface portion 24 may be configured with the cover material 20 alone corresponding to the disposition position or the like of the interior member for a vehicle.

In the embodiments, the interior member for a vehicle is provided with the conductive portion 34 or the conductive portion 54. However, the interior member for a vehicle may be provided with the conductive portion 34 and the conductive portion 54 corresponding to the disposition positions or the like of the electrical components.

In the first embodiment, the conductive portion 34 and the base material 16 are provided through two-color molding. However, various manufacturing methods can be utilized corresponding to the configuration or the like of the instrument panel 14. For example, the conductive portion 34 and the base material 16 may be formed through insert molding and a configuration in which the conductive portion 34 and the base material 16 are configured separately from each other and the conductive portion 34 is fitted into a groove portion provided in the base material 16 may also be adopted.

What is claimed is:

1. An interior member for a vehicle, the interior member comprising:
    a base material formed of a resin;
    a front surface portion configured to constitute a portion of a design surface in a vehicle cabin and configured to cover a surface of the base material that is on a design surface side; and
    a conductive portion integrally provided with the base material, a portion of the conductive portion that is opposite to the design surface being in close contact with the base material, a portion of the conductive portion that is on the design surface side facing the front surface portion, electric power being supplied to an electrical component installed in the vehicle through the conductive portion, the conductive portion being formed of a metal, wherein:
    the base material constitutes a portion of an instrument panel, and
    the front surface portion includes
        a foam layer that is in close contact with the base material while being disposed on a portion of the base material that is on the design surface side, and
        a cover material that constitutes the design surface and is in close contact with the foam layer.

2. The interior member according to claim 1, wherein the base material and the conductive portion are formed through two-color molding and constitute an integrated molded product.

3. The interior member according to claim 1, wherein the base material is provided with a rib portion that protrudes from a surface of the base material that is opposite to the design surface.

4. The interior member according to claim 1, wherein a portion of the conductive portion is exposed at a surface of the base material that is opposite to the design surface.

5. An interior member for a vehicle, the interior member comprising:
    a base material formed of a resin;
    a front surface portion configured to constitute a portion of a design surface in a vehicle cabin and configured to cover a surface of the base material that is on a design surface side; and
    a conductive portion built into the base material, electric power is supplied to an electrical component installed in the vehicle through the conductive portion, the conductive portion being formed of a metal, wherein:
    the base material constitutes a portion of an instrument panel, and
    the front surface portion includes
        a foam layer that is in close contact with the base material while being disposed on a portion of the base material that is on the design surface side, and
        a cover material that constitutes the design surface and is in close contact with the foam layer.

6. The interior member according to claim 3, wherein the base material is provided with a rib portion that protrudes from a surface of the base material that is opposite to the design surface.

7. The interior member according to claim 3, wherein a portion of the conductive portion is exposed at a surface of the base material that is opposite to the design surface.

* * * * *